(12) United States Patent
Ueno

(10) Patent No.: US 9,806,068 B2
(45) Date of Patent: Oct. 31, 2017

(54) SEMICONDUCTOR DEVICE

(71) Applicant: FUJI ELECTRIC CO., LTD., Kanagawa (JP)

(72) Inventor: Katsunori Ueno, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/417,243

(22) Filed: Jan. 27, 2017

(65) Prior Publication Data

US 2017/0271314 A1 Sep. 21, 2017

(30) Foreign Application Priority Data

Mar. 16, 2016 (JP) .................................. 2016-052045

(51) Int. Cl.
*H01L 29/74* (2006.01)
*H01L 25/18* (2006.01)
(Continued)

(52) U.S. Cl.
CPC .......... *H01L 25/18* (2013.01); *H01L 23/3114* (2013.01); *H01L 29/1608* (2013.01);
(Continued)

(58) Field of Classification Search
None
See application file for complete search history.

(56) References Cited

U.S. PATENT DOCUMENTS 7,501,670 B2 * 3/2009 Murphy ............. H01L 27/0605
257/194
2008/0230784 A1 9/2008 Murphy
(Continued)

FOREIGN PATENT DOCUMENTS

JP H05-315600 A 11/1993
JP H10-294471 A 11/1998
(Continued)

OTHER PUBLICATIONS

Office Action issued for counterpart Japanese Application 2016-052045, issued by the Japan Patent Office dated Apr. 12, 2016.
(Continued)

*Primary Examiner* — Jack Chen

(57) ABSTRACT

Inside an IGBT using GaN or SiC, light having an energy of approximately 3 [eV] is generated. Therefore, defects are caused in the gate insulating film of the IGBT. Furthermore, the charge trapped at a deep level becomes excited and moves to the channel region, thereby causing the gate threshold voltage to fluctuate from the predetermined value. Provided is a semiconductor device including a normally-ON semiconductor element that includes a first semiconductor layer capable of conductivity modulation and a first gate electrode, but does not include a gate insulating film between the first gate electrode and the first semiconductor layer; and a normally-OFF semiconductor element that includes a second semiconductor layer, a second gate electrode, and a gate insulating film between the second semiconductor layer and the second gate electrode. The normally-ON semiconductor element and the normally-OFF semiconductor element are connected in series.

9 Claims, 9 Drawing Sheets

(51) Int. Cl.
*H01L 29/739* (2006.01)
*H01L 29/16* (2006.01)
*H01L 29/20* (2006.01)
*H01L 23/31* (2006.01)

(52) U.S. Cl.
CPC ...... *H01L 29/2003* (2013.01); *H01L 29/7392* (2013.01); *H01L 29/7396* (2013.01)

(56) References Cited

U.S. PATENT DOCUMENTS

| | | |
|---|---|---|
| 2011/0199148 A1 | 8/2011 | Iwamura |
| 2013/0335134 A1 | 12/2013 | Kanazawa |
| 2015/0115285 A1 | 4/2015 | Kinoshita et al. |

FOREIGN PATENT DOCUMENTS

| | | |
|---|---|---|
| JP | H11-274482 A | 10/1999 |
| JP | 2004-6723 A | 1/2004 |
| JP | 2012-243905 A | 12/2012 |

OTHER PUBLICATIONS

Office Action issued for counterpart Japanese Application 2016-052045, issued by the Japan Patent Office dated Aug. 23, 2016.

\* cited by examiner

US 9,806,068 B2

SEMICONDUCTOR DEVICE

The contents of the following Japanese patent application are incorporated herein by reference: NO. 2016-052045 filed in JP on Mar. 16, 2016.

BACKGROUND

1. Technical Field

The present invention relates to a semiconductor device.

2. Related Art

A semiconductor element including GaN (gallium nitride) or SiC (Silicon carbide) has higher power conversion efficiency than a semiconductor element including Si (silicon). For example, a semiconductor device including GaN or SiC has a smaller amount of power loss than a semiconductor device including Si, and is therefore expected to realizing an energy saving effect. Conventionally, FETs (Field Effect Transistors) using GaN or SiC are provided with a cascode connection, as shown in Patent Documents 1 and 2, for example. Furthermore, FETs using SiC are provided in a cascade connection with FETs using Si, as shown in Patent Document 3, for example.

Patent Document 1: Unexamined Japanese Patent Application Publication No. 2010-522432
Patent Document 2: Japanese Patent Application Publication No. 2011-166673
Patent Document 3: Japanese Patent Application Publication No. 2014-3110

An IGBT (Insulated Gate Bipolar Transistor) using GaN or SiC is examined as a device that has a withstand voltage greater than or equal to 5 [kV] and a low ON voltage. In the IGBT using GaN or SiC, light having an energy of approximately 3 [eV], which is close to the bandgap energy of GaN or SiC, is generated inside the IGBT. Therefore, there is a problem that defects are caused in the gate insulating film of the IGBT due to the light with an energy of approximately 3 [eV]. Furthermore, there is a problem that this light with an energy of approximately 3 [eV] causes the charge trapped at a deep level in the gate insulating film to become excited and move to the channel region, thereby causing the gate threshold voltage to fluctuate from the predetermined value.

SUMMARY

According to a first aspect of the present invention, provided is a semiconductor device comprising a normally-ON semiconductor element and a normally-OFF semiconductor element. The normally-ON semiconductor element may include a first semiconductor layer and a first gate electrode. The first semiconductor layer may be capable of conductivity modulation. The normally-ON semiconductor layer does not need to include a gate insulating film between the first gate electrode and the first semiconductor layer. The normally-OFF semiconductor element may include a second semiconductor layer, a second gate electrode, and a gate insulating film between the second semiconductor layer and the second gate electrode. The normally-ON semiconductor element and the normally-OFF semiconductor element may be connected in series.

The normally-ON semiconductor element and the normally-OFF semiconductor element may have a cascade connection, such that the normally-ON semiconductor element is turned OFF when the normally-OFF semiconductor element is turned OFF.

The normally-OFF semiconductor element may be one of an IGBT having an emitter electrode and a MOSFET having a source electrode. The normally-ON semiconductor element may be a static induction thyristor. In the cascode connection, the first gate electrode of the static induction thyristor may be electrically connected to one of the emitter electrode and the source electrode of the normally-OFF semiconductor element.

The second semiconductor layer of the normally-OFF semiconductor element may include one of silicon carbide and gallium nitride.

The first semiconductor layer of the normally-ON semiconductor element may include one of silicon carbide and gallium nitride.

The normally-ON semiconductor element may have a higher withstand voltage than the normally-OFF semiconductor element.

The semiconductor device may further comprise a first semiconductor substrate and a second semiconductor substrate. The first semiconductor substrate may have the normally-ON semiconductor element provided thereon. The second semiconductor substrate may have the normally-OFF semiconductor element provided thereon. The second semiconductor substrate may be different from the first semiconductor substrate.

The semiconductor device may further comprise a substrate on which the first semiconductor substrate and the second semiconductor substrate are mounted.

The semiconductor device may further comprise light-blocking resin between the first semiconductor substrate and the second semiconductor substrate.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
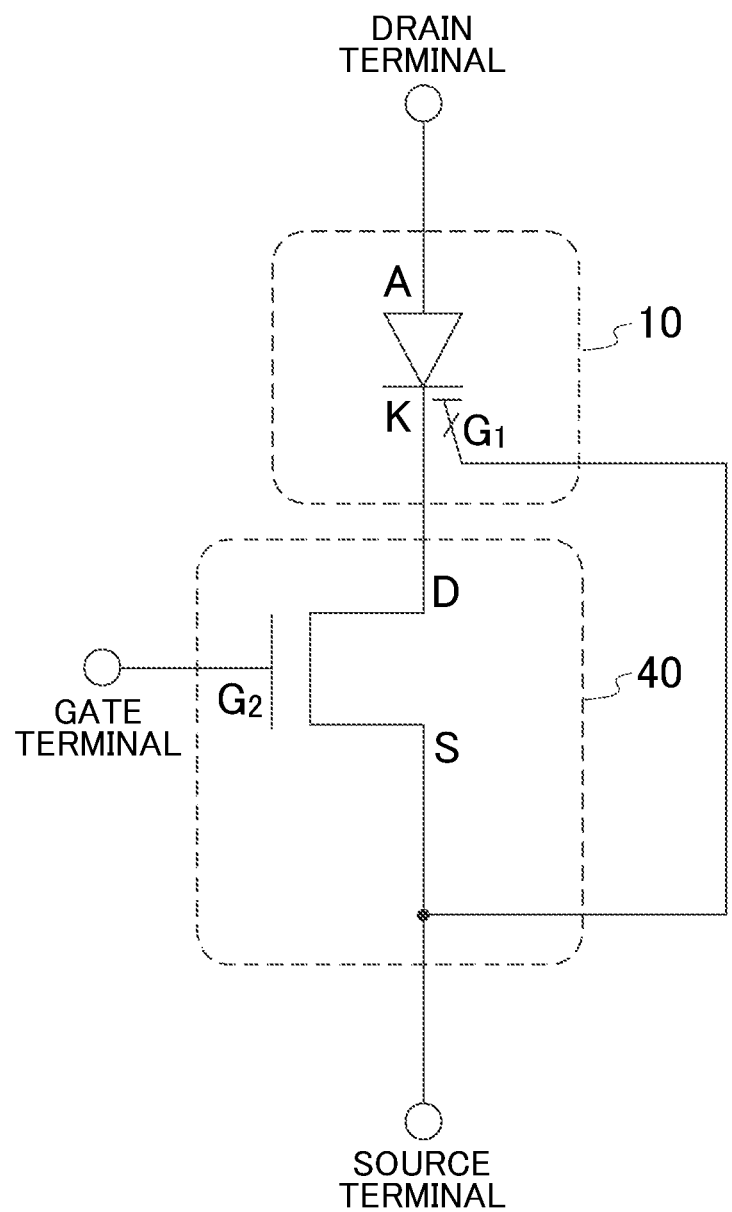
FIG. 1 is a circuit diagram of a semiconductor device 100 according to a first embodiment.

FIG. 1 is a circuit diagram of a semiconductor device 100 according to a first embodiment. The semiconductor device 100 in this example includes a SI thyristor (Static Induction Thyristor) 10 serving as a normally-ON semiconductor element and a MOSFET 40 serving as a normally-OFF semiconductor element.

The SI thyristor 10 includes an anode A, a cathode K, and a gate $G_1$. The anode A, the cathode K, and the gate $G_1$ may correspond respectively to an anode electrode 32, a cathode electrode 36, and a gate electrode 34 serving as a first gate electrode, which are described further below.

The SI thyristor 10 differs from a general thyristor that has a pnpn structure. In the present example, the source terminal and the gate terminal $G_1$ are electrically connected. Furthermore, in the present example, the potential of the source terminal is 0 [V], and therefore the potential of the gate $G_1$ is 0 [V]. At this time, if the potential of the anode A is greater than the potential of the cathode K by at least a forward voltage Vf, a forward current flows from the anode A to the cathode K. In the present example, the potential of the gate $G_1$ is not controlled by potential manipulation from the outside. In other words, the SI thyristor 10 can be treated as a normally-ON semiconductor element.

The MOSFET 40 includes a drain D, a source S, and a gate $G_2$. The drain D, the source S, and the gate $G_2$ may correspond respectively to a drain electrode 62, a source electrode 66, and a gate electrode 64 serving as a second gate electrode, which are described further below.

In the present example, the SI thyristor 10 and the MOSFET 40 are connected in series. In particular, in the present example, the SI thyristor 10 and the MOSFET 40 have a cascode connection. In other words, in the present example, the gate $G_1$ and the source S are electrically connected, and the cathode K and the drain D are electrically connected.

In the present example, an external terminal that electrically connects to the anode A is referred to as a drain terminal. An external terminal that electrically connects to the source S and the gate $G_1$ is referred to as a source terminal. An external terminal that electrically connects to the gate $G_2$ is referred to as a gate terminal.

Figure 2:
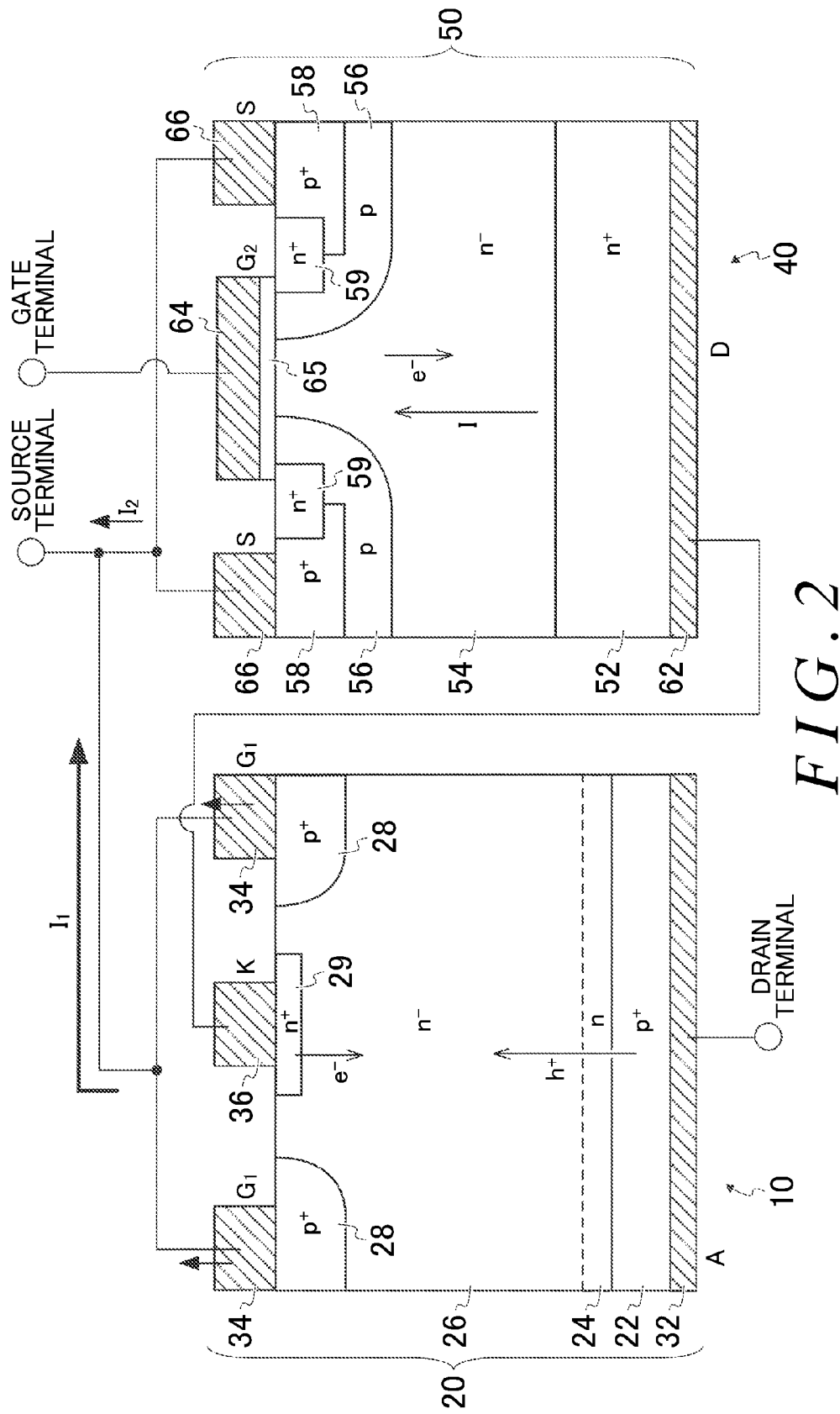
FIG. 2 is a cross-sectional view of essential components of the SI thyristor 10 and the MOSFET 40.

FIG. 2 is a cross-sectional view of essential components of the SI thyristor 10 and the MOSFET 40. The SI thyristor 10 is formed on a semiconductor substrate 20 serving as a first semiconductor substrate. The MOSFET 40 is formed on a semiconductor substrate 50 serving as a second semiconductor substrate, which is a different semiconductor substrate from the semiconductor substrate 20. In the present example, the term "semiconductor substrate" has a scope including the electrodes provided on the front surface and the back surface thereof. The present example shows only a cross section of the essential components, but the SI thyristor 10 and the MOSFET 40 may each have a repeating structure in the horizontal direction in the drawing. Furthermore, the SI thyristor 10 and the MOSFET 40 may each extend as a stripe in a direction into the plane of the drawing or out from the plane of the drawing.

In this Specification, "n" and "p" refer respectively to the majority of carriers being electrons and the majority of carriers being holes. Furthermore, the "+" and "−" signs written to the upper right of "n" and "p" respectively mean that the carrier concentration is higher than in a case where a "+" sign is not written and that the carrier concentration is lower than in a case where a "−" sign is not written. This Specification describes an example in which the drift layer and the semiconductor layer in which conductivity modulation occur are n-type. However, in another example, the drift layer and this semiconductor layer may be p-type. In this other example, someone skilled in the art can understand how to form each semiconductor element. In this Specification, E indicates 10 raised to a certain power. For example, 1E+16 means $1 \times 10^{16}$.

(The SI Thyristor 10)

The semiconductor substrate 20 includes a $p^+$-type layer 22, an n-type layer 24, an $n^-$-type layer 26 serving as a first semiconductor layer, a $p^+$-type region 28, an $n^+$-type region 29, an anode electrode 32, a gate electrode 34, and a cathode electrode 36. The semiconductor substrate may be referred to as a semiconductor chip. The semiconductor layers including the $p^+$-type layer 22, the n-type layer 24, the $n^-$-type layer 26, the $p^+$-type region 28, and the $n^+$-type region 29 may include one of SiC and GaN. By using SiC or GaN for these semiconductor layers, it is possible to give the SI thyristor 10 a higher withstand voltage than in a case where Si is used for these semiconductor layers. The semiconductor layers in the present example include GaN.

In the present example, the anode electrode 32 is positioned on the back surface of the semiconductor substrate 20, and the gate electrode 34 and the cathode electrode 36 are positioned on the front surface of the semiconductor substrate 20. The SI thyristor 10 does not include a gate insulating film between the gate electrode 34 and the $n^-$-type layer 26. In other words, the gate electrode 34 in the present example directly contacts the $p^+$-type region 28. When the potential of the gate electrode 34 is lower than the potential of the anode electrode 32, $h^+$ (holes) are pulled out from the $n^-$-type layer 26 into the gate electrode 34. Therefore, in the present example, the gate electrode 34 can become a hole current path.

In the present example where the semiconductor layers are GaN, the n-type impurities may be one or more types of elements from among Si (silicon), Ge (germanium), and O (oxygen). Furthermore, the p-type impurities may be one or more types of elements from among Mg (magnesium), Ca (calcium), Be (beryllium), and Zn (zinc). In contrast to this, in a case where the semiconductor layers are SiC, the n-type impurities may be one or more types of elements from among N (nitrogen) and P (phosphorous), and the p-type impurities may be one or more types of elements from among Al (aluminum) and B (Boron).

The n-type layer 24 is positioned on the $p^+$-type layer 22. The n-type layer 24 may have a function to stop the expansion of the depletion layer, when the depletion layer expands downward from the $p^+$-type region 28. The $n^-$-type layer 26 is positioned on the n-type layer 24. The $p^+$-type region 28 is positioned under the gate electrode 34 of the $n^-$-type layer 26. Furthermore, the $n^+$-type region 29 is positioned under the cathode electrode 36 of the $n^-$-type layer 26. The cathode electrode 36 and the $n^+$-type region 29 are directly connected. In the present embodiment, the direction from the anode electrode 32 toward the cathode electrode 36 is referred to as "up." The opposite of this direction is referred to as "down."

When the anode electrode 32 has a voltage that is higher than the voltage of the cathode electrode 36 by at least a forward voltage Vf, $h^+$ (holes) are implanted from the $p^+$-type layer 22 into the $n^-$-type layer 26 and $e^-$ (electrons) are implanted from the $n^+$-type region 29 into the $n^-$-type layer 26. In this way, conductivity modulation occurs in the $n^-$-type layer 26, and the hole current flows from the anode electrode 32 to the cathode electrode 36. In other words, the SI thyristor 10 is a bipolar semiconductor element in which the hole current flows from the anode electrode 32 to the cathode electrode 36 as a result of a forward bias greater than or equal to the forward voltage Vf being applied.

The SI thyristor 10 may have a higher withstand voltage than the MOSFET 40. In the present example, the SI thyristor 10 has a withstand voltage of 5 [kV] and the MOSFET 40 has a withstand voltage of 100 [V]. In the SI thyristor 10 of the present example, a first main current $I_1$ flows from the anode A to the source S via the gate $G_1$. In contrast to this, in the MOSFET 40 of the present example, a second main current $I_2$ flows from the drain D to the source S.

(The MOSFET 40)

The semiconductor substrate 50 includes an $n^+$-type drain layer 52, an $n^-$-type drift layer 54 serving as a second semiconductor layer, a p-type base region 56, a $p^+$-type contact region 58, an $n^+$-type source region 59, a drain electrode 62, a gate electrode 64, a gate insulating film 65, and a source electrode 66. In the present example, the semiconductor layers of the drain layer 52, the drift layer 54, the base region 56, the contact region 58, and the source region 59 are Si layers. The elements used as the n-type and p-type impurities for the Si layers may be the same as the examples of elements used when the semiconductor layers are SiC.

The drain electrode 62 is positioned on the back surface of the semiconductor substrate 50, and the gate electrode 64 and the source electrode 66 are positioned on the front surface of the semiconductor substrate 50. The MOSFET 40 includes the gate insulating film 65 between the drift layer 54 and the gate electrode 64. In particular, the gate insulating film 65 is provided between the gate electrode 64 and the base region 56 provided in the drift layer 54. The base region 56 that is under the gate insulating film 65 and between the drift layer 54 and the source region 59 functions as a channel formation region.

When the potential of the gate electrode 64 is greater than or equal to a prescribed potential, a charge inversion layer is formed in the channel formation region. At this time, when the potential of the drain electrode 62 is higher than the potential of the source electrode 66, an electron current flows from the source electrode 66 to the drain electrode 62. In other words, a current I flows from the drain electrode 62 to the source electrode 66. The MOSFET 40 is a unipolar semiconductor element in which only $e^-$ (electrons) are implanted into the drift layer 54.

In another example, the semiconductor layers of the drain layer 52, the drift layer 54, the base region 56, the contact region 58, and the source region 59 may include one of SiC and GaN. The MOSFET 40 is a unipolar semiconductor element, and therefore does not emit light even if the semiconductor layers are SiC or GaN. Therefore, compared to a bipolar semiconductor element, it is possible to reduce the effect on the gate insulating film 65.

Figure 3:
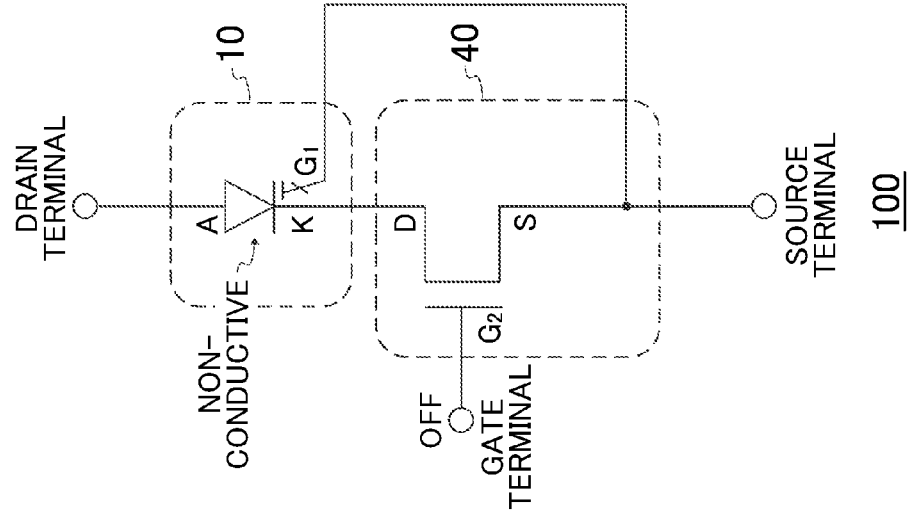
FIG. 3 shows a state in which a forward bias is applied to the semiconductor device 100, in which (a) shows a state after the gate $G_2$ has been turned ON, (b) shows a transient state after the gate $G_2$ has been turned OFF, and (c) shows a steady state in which the current flowing through the semiconductor device 100 has been cut off after the gate $G_2$ has been turned OFF.
Figure 3:
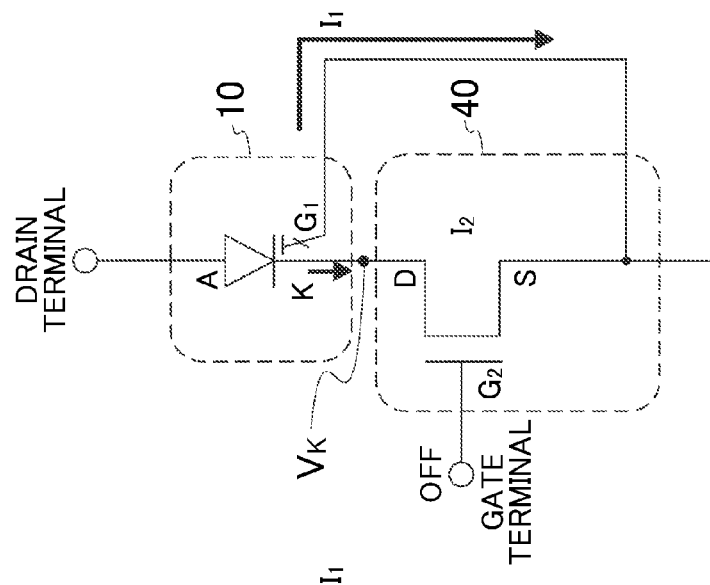
Figure 3:
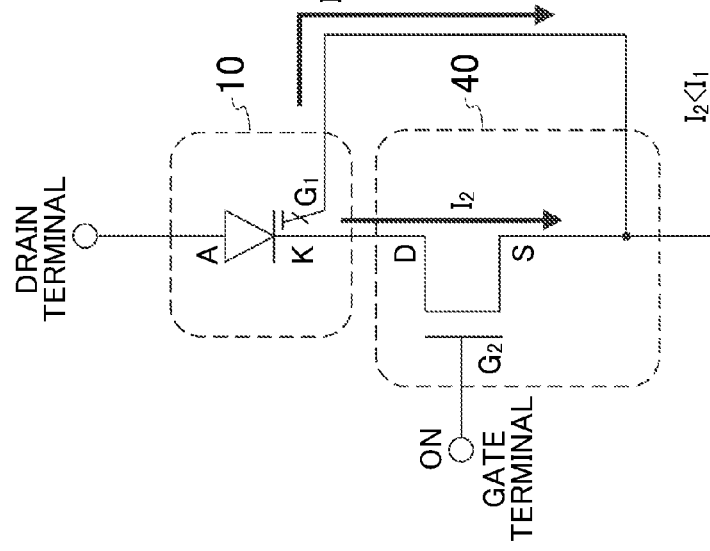

FIG. 3 shows a state in which a forward bias is applied to the semiconductor device 100. In FIG. 3, (a) shows a state after the gate $G_2$ has been turned ON, (b) shows a transient state after the gate $G_2$ has been turned OFF, and (c) shows a steady state in which the current flowing through the semiconductor device 100 has been cut off after the gate $G_2$ has been turned OFF.

As shown in (a), when there is a forward bias, the potential of the drain terminal is higher than the potential of the source terminal, and therefore the current $I_1$ flows from the gate $G_1$ to the source S. Furthermore, since the gate $G_2$ is also in the ON state, the current $I_2$ flows from the drain D to the source S via the cathode K and the MOSFET 40. When the forward bias is applied to the semiconductor device 100, the source terminal is 0 [V], for example.

When the prescribed current I flows through the semiconductor device 100 having a cascode connection, in the case of a comparative example in which two MOSFETs 40 are in a cascode connection, it is necessary for an electron current $i_e$ whose absolute value is equal to that of the current I to flow through each MOSFET 40. In contrast to this, in the case of the present example in which the MOSFET 40 and the SI thyristor 10 are in a cascode connection, an electron current $I_2$ whose absolute value is smaller than that of the current I flows through the MOSFET 40 and a hole current $I_1$ whose absolute value is smaller than that of the current I flows through the SI thyristor 10, and therefore it is possible for the prescribed current I to flow through the semiconductor device 100. Therefore, the present example can realize a smaller chip size for the MOSFET 40 than the comparative example. Accordingly, in the present example, it is possible to conserve the materials needed to manufacture the normally-OFF semiconductor element. Furthermore, since the SI thyristor 10 usually has a lower resistance than the MOSFET 40, the present example can realize a smaller chip size for the SI thyristor 10 than the comparative example.

In the present example, a greater amount of current flows through the SI thyristor 10 than through the MOSFET 40, but since the SI thyristor 10 does not include a gate insulating film, there is absolutely no effect on the gate insulating film that causes light emission. Accordingly, the SI thyristor 10 in the present example can realize a semiconductor element with a high withstand voltage using GaN while avoiding the problem of the gate insulating film causing light emission. Therefore, the SI thyristor 10 in the present example can prevent deterioration of the characteristics of the elements compared to a normally-ON semiconductor element that includes one of SiC and GaN and also a gate insulating film. The MOSFET 40 in the present embodiment is a semiconductor element that includes an Si layer, and therefore light emission does not occur in the drift layer 54.

As shown in (b), when the gate $G_2$ is turned OFF, the current $I_2$ in the MOSFET 40 is cut off. In other words, the MOSFET 40 is turned OFF. However, in the transient state shown in (b), the forward bias is still applied to the semiconductor device 100, and therefore a certain amount of current flows from the anode A to the cathode K in the SI thyristor 10. As a result, the potential ($V_K$) of the cathode K gradually rises. Furthermore, the current $I_1$ also flows from the anode A to the source S via the gate $G_1$.

When the potential of the cathode K becomes lower than the potential of the anode A, the depletion layer expands in the SI thyristor 10 and the current flowing through the SI thyristor 10 is cut off. In particular, in the SI thyristor 10, the depletion layer expands between the $p^+$-type region 28 and the $n^+$-type region 29 in the $n^-$-type layer 26. As a result, the current $I_2$ flowing from the gate $G_1$ toward the source terminal is also cut off. In this way, the state shown in (c) is reached.

In other words, in the present example, the MOSFET 40 and the SI thyristor 10 are given a cascode connection such that the SI thyristor 10 is also turned OFF when the MOSFET 40 is turned OFF. Accordingly, by turning the gate $G_2$ of the MOSFET 40 ON and OFF, the ON/OFF state of the semiconductor device 100 can be controlled.

Figure 4:
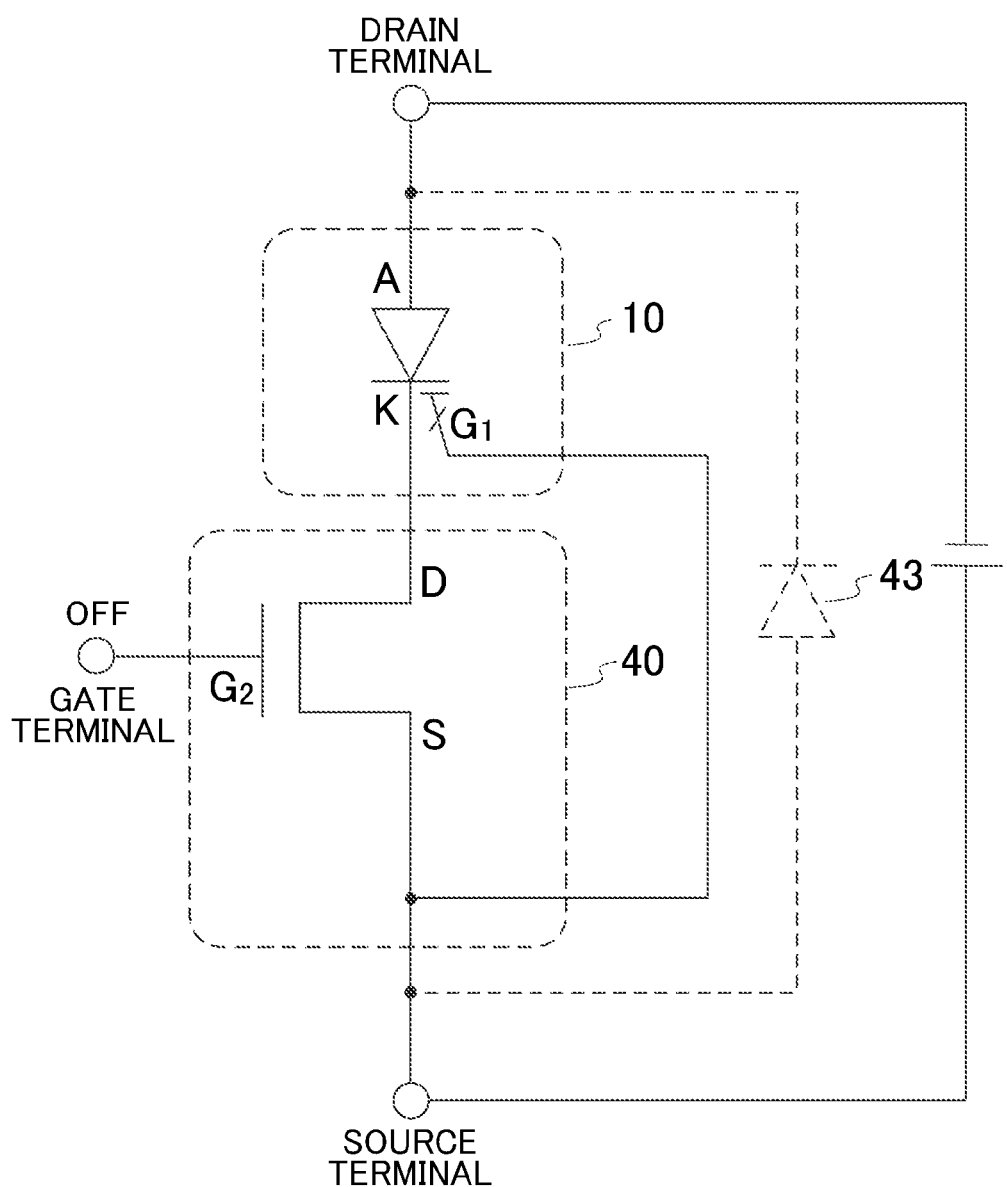
FIG. 4 shows a state in which a reverse bias is applied to the semiconductor device 100.

FIG. 4 shows a state in which a reverse bias is applied to the semiconductor device 100. In the present example, for ease of understanding, a power source is described that applies a negative bias and a positive bias respectively to the drain terminal and the source terminal. In the present embodiment, in the same manner as shown in (b) and (c) of FIG. 3, the gate $G_2$ is in the OFF state. Therefore, current does not flow through the semiconductor device 100. In the first embodiment, an FWD (Free Wheeling Diode) 43 may be included such that the semiconductor device 100 can conduct when a reverse bias is applied. The FWD 43 is shown by a dotted line, in order to indicate that the FWD 43 is optional. The anode of the FWD 43 may be electrically connected to the source terminal, and the cathode of the FWD 43 may be electrically connected to the drain terminal.

Figure 5:
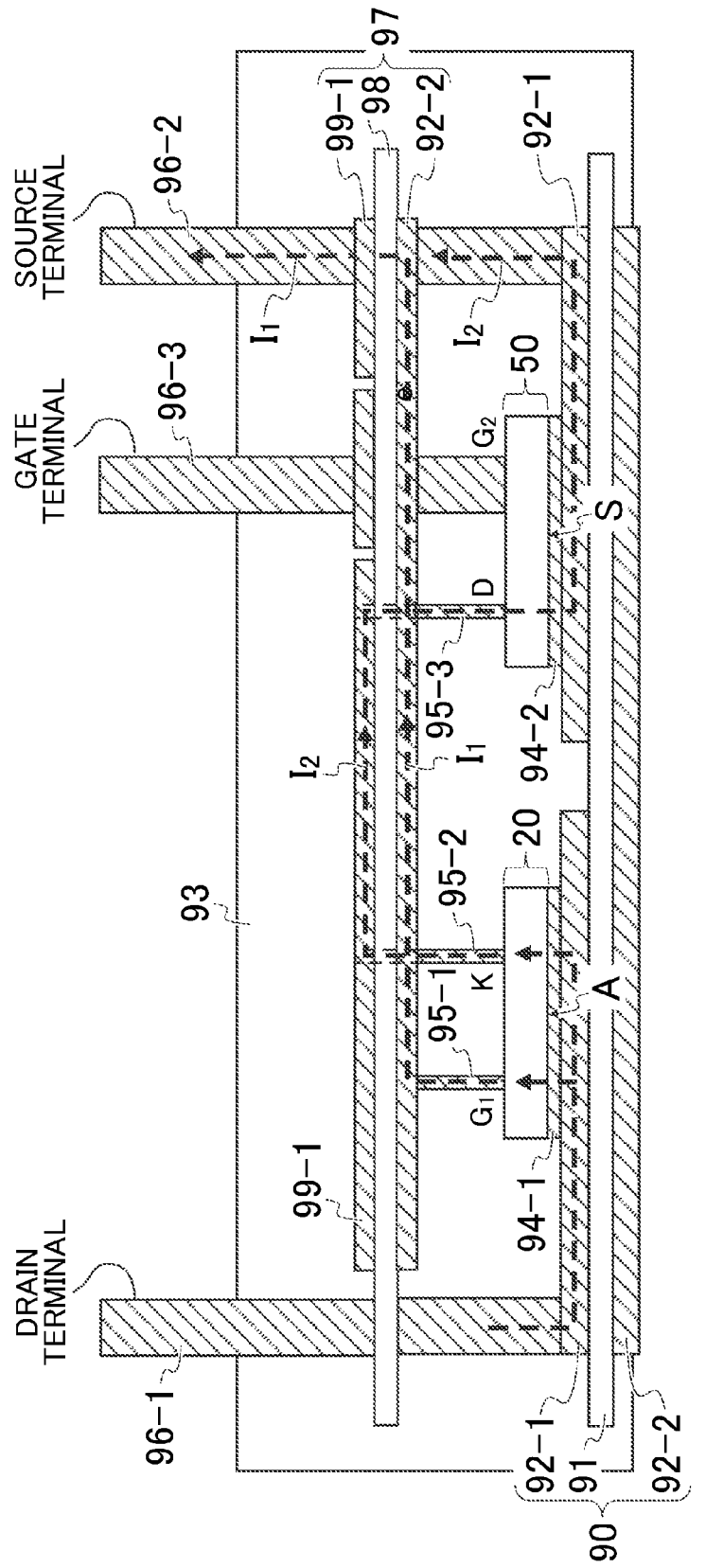
FIG. 5 shows an exemplary configuration of the semiconductor device 100 in which the semiconductor substrate 20 and the semiconductor substrate 50 are provided on one substrate 90.

FIG. 5 shows an exemplary configuration of the semiconductor device 100 in which the semiconductor substrate 20 and the semiconductor substrate 50 are provided on one substrate 90. In the present example, the semiconductor device 100 further includes the substrate 90, resin 93, a conductive adhesive layer 94, a plurality of conductive posts 95, a plurality of external output terminals 96, and a print board 97. FIG. 5 shows one semiconductor substrate 20 and one semiconductor substrate 50 in order to simplify the description, but a plurality of semiconductor substrates 20, a plurality of semiconductor substrates 50, and a plurality of semiconductor substrates having other elements may be mounted on the substrate 90.

The substrate 90 includes an insulated substrate 91 and a conducting layer 92. The insulated substrate 91 in the present example includes alumina. In the present example, a conducting layer 92-1 is provided on the front surface of the insulated substrate 91 and a conducting layer 92-2 is provided on the back surface of the insulated substrate 91. The conducting layer 92-1 may have a prescribed wiring pattern.

As described above, the semiconductor substrate 20 includes the anode electrode 32 on the back surface thereof. The anode electrode 32 is electrically connected to the conducting layer 92-1 via a conductive adhesive layer 94-1. Furthermore, as described above, the semiconductor substrate 50 includes the source electrode 66 on the back surface thereof. The source electrode 66 is electrically connected to the conducting layer 92-1 via a conductive adhesive layer 94-2. The conducting layer 92-1 in the present example includes a prescribed circuit pattern that electrically separates the anode electrode 32 and the source electrode 66.

The conducting layer 92-1 electrically connects the anode A of the SI thyristor 10 and an external output terminal 96-1. Furthermore, the conducting layer 92-1 electrically connects the source S of the MOSFET 40 and an external output terminal 96-2. The conducting layer 92-2 has a function to release heat of the semiconductor device 100 to the outside. The external output terminal 96-1 functions as a drain terminal, and the external output terminal 96-2 functions as a source terminal.

The print board 97 is provided facing the front surface of the substrate 90. The print board 97 includes an insulated substrate 98 and a conducting layer 99. The insulated substrate 98 in the present example includes alumina. In the present example, a conducting layer 99-1 is provided on the front surface of the insulated substrate 98 and a conducting layer 99-2 is provided on the back surface of the insulated substrate 98. The conducting layer 99 may have a prescribed wiring pattern.

The conducting layer 99-1 in the present example electrically connects the cathode K and the drain D, via a conductive post 95-2 and a conductive post 95-3. Furthermore, the conducting layer 99-2 electrically connects the gate $G_1$ and the external output terminal 96-2, via a conductive post 95-1. The external output terminal 96-3 is electrically connected to the gate $G_2$. The external output terminal 96-3 in the present example protrudes farther upward than the print board 97, without electrically connecting to the conducting layer 99.

The semiconductor substrate 20 in the present example includes a GaN semiconductor layer. Therefore, the SI thyristor 10 has the possibility of emitting light. However, in the present example, the semiconductor substrate 20 and the semiconductor substrate 50 are mounted on the substrate 90 with a distance of at least several millimeters therebetween. Therefore, even if the semiconductor substrate 20 were to emit light, the effect on the gate insulating film 65 of the adjacent MOSFET 40 could be reduced.

In the present example, all of the configurational components, except for the top portion of the external output terminal 96 and the back surface of the conducting layer 92-2, are covered by the resin 93. In the present example, after the substrate 90, the semiconductor substrate 20, the semiconductor substrate 50, the conductive post 95, the external output terminal 96, and the print board 97 have been assembled, this structure is mounted in a prescribed mold. The semiconductor device 100 is then manufactured by pouring the resin 93 into this prescribed mold.

The resin 93 may be a light-blocking resin obtained by adding a filler such as silica into an epoxy resin. In this way, the resin 93 also enters into the space between the semiconductor substrate 20 and the semiconductor substrate 50. Therefore, it is possible to block light between the semiconductor substrate 20 and the semiconductor substrate 50 using the resin 93. As a result, the effect of the light generation of the SI thyristor 10 can be more reliably eliminated.

Figure 6:
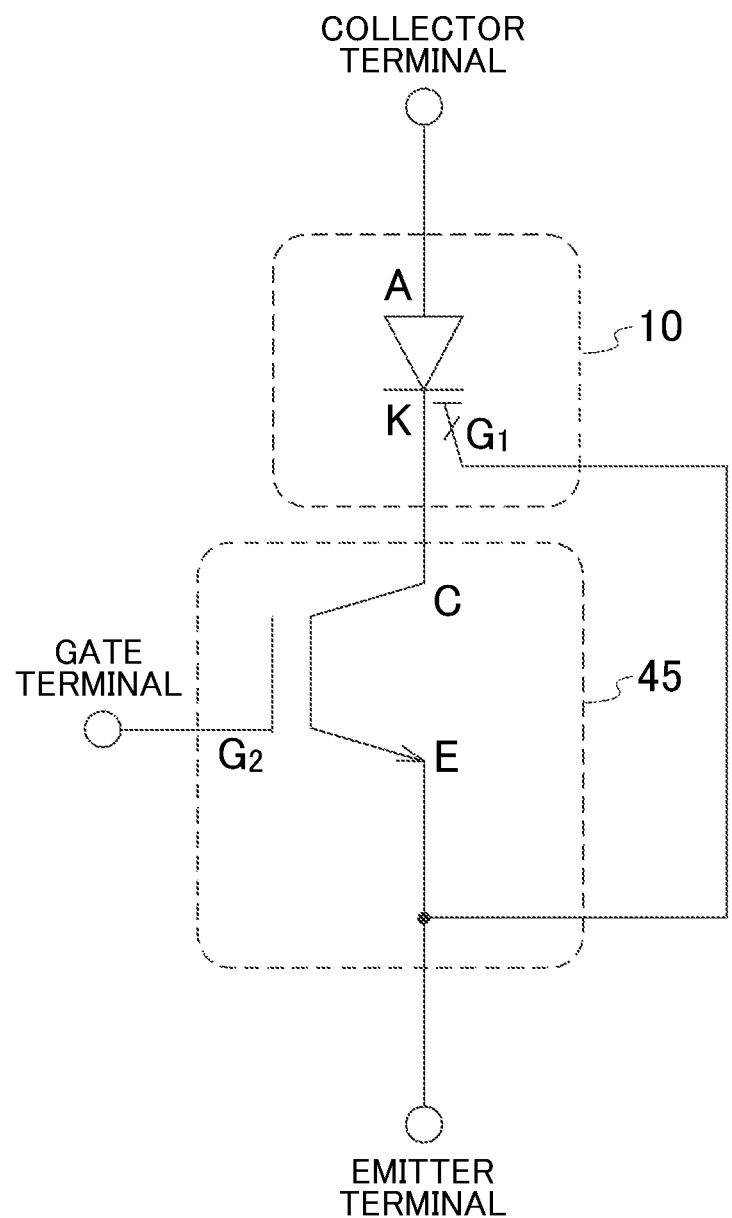
FIG. 6 is a circuit diagram of a semiconductor device 200 according to a second embodiment.

FIG. 6 is a circuit diagram of a semiconductor device 200 according to a second embodiment. The semiconductor device 200 in the present example includes an IGBT 45 as a normally-OFF semiconductor element. The IGBT 45 includes a collector C, an emitter E, and a gate $G_2$. The collector C, the emitter E, and the gate $G_2$ may correspond respectively to the collector electrode 82, the emitter electrode 86, and the gate electrode 84 serving as a second gate electrode.

In the present example as well, the SI thyristor 10 and the IGBT 45 are connected in series. Specifically, the SI thyristor 10 and the IGBT 45 have a cascode connection. In other words, in the present example, the gate $G_1$ and the emitter E are electrically connected, and the cathode K and the collector C are electrically connected. The second embodiment differs from the first embodiment with regard to this point.

Figure 7:
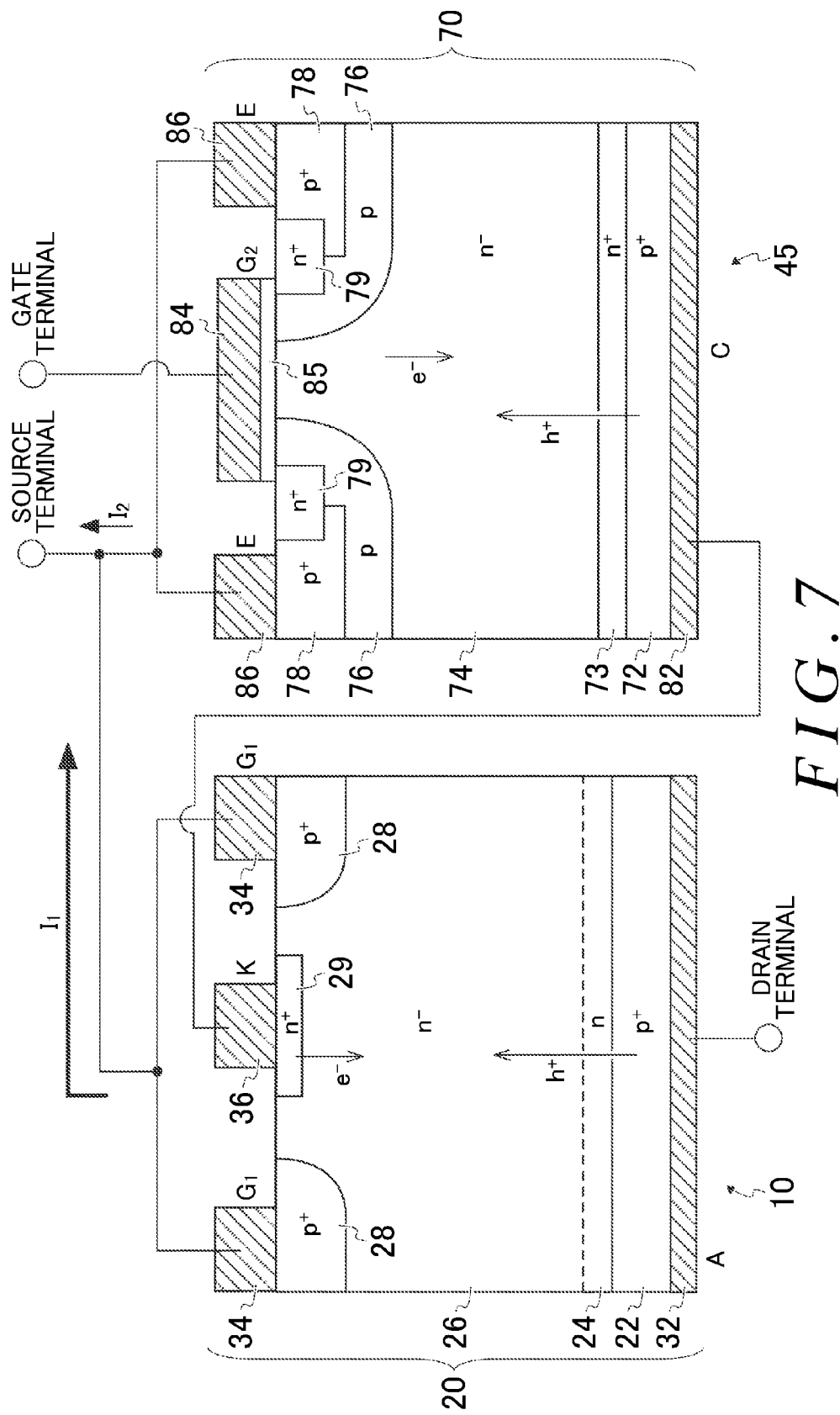
FIG. 7 is a cross-sectional view of the essential components of the SI thyristor 10 and the IGBT 45.

FIG. 7 is a cross-sectional view of the essential components of the SI thyristor 10 and the IGBT 45. The configuration of the SI thyristor 10 is the same as in the first embodiment, and therefore a description thereof is omitted. In the present example, the IGBT 45 is provided on the semiconductor substrate 70. In other words, the second embodiment differs from the first embodiment in that the normally-OFF semiconductor element is a bipolar semiconductor element.

The semiconductor substrate 70 includes a $p^+$-type collector layer 72, an FS (Field Stop) layer 73, an $n^-$-type drift layer 74 serving as a second semiconductor layer, a p-type base region 76, a $p^+$-type contact region 78, an $n^+$-type emitter region 79, a collector electrode 82, a gate electrode 84, a gate insulating film 85, and an emitter electrode 86. In the present example, the semiconductor layers including the collector layer 72, the drift layer 74, the base region 76, the contact region 78, and the emitter region 79 are Si layers.

In another example, these semiconductor layers may include one of SiC and GaN. In this case as well, in the same manner as in the first embodiment, the amount of current flowing in the IGBT 45 is less than in the SI thyristor 10, and therefore it is possible to reduce the effect of the light generation on the gate insulating film 85.

The collector electrode 82 is positioned on the back surface of the semiconductor substrate 70, and the gate electrode 84 and the emitter electrode 86 are positioned on the front surface of the semiconductor substrate 70. The IGBT 45 includes the gate insulating film 85 between the drift layer 74 and the gate electrode 84. The base region 56 that is under the gate insulating film 85 and between the drift layer 74 and the emitter region 79 functions as a channel formation region.

When the gate electrode 84 has a potential that is greater than or equal to a prescribed potential, a charge inversion layer is formed in the channel formation region. At this time, when the potential of the collector electrode 82 is higher than the potential of the emitter electrode 86, $h^+$ (holes) are implanted into the drift layer 74 from the collector layer 72. Furthermore $e^-$ (electrons) are implanted into the drift layer 74 from the emitter region 79. As a result, conductivity modulation occurs in the drift layer 74 and a hole current flows from the collector electrode 82 to the emitter electrode 86.

Figure 8:
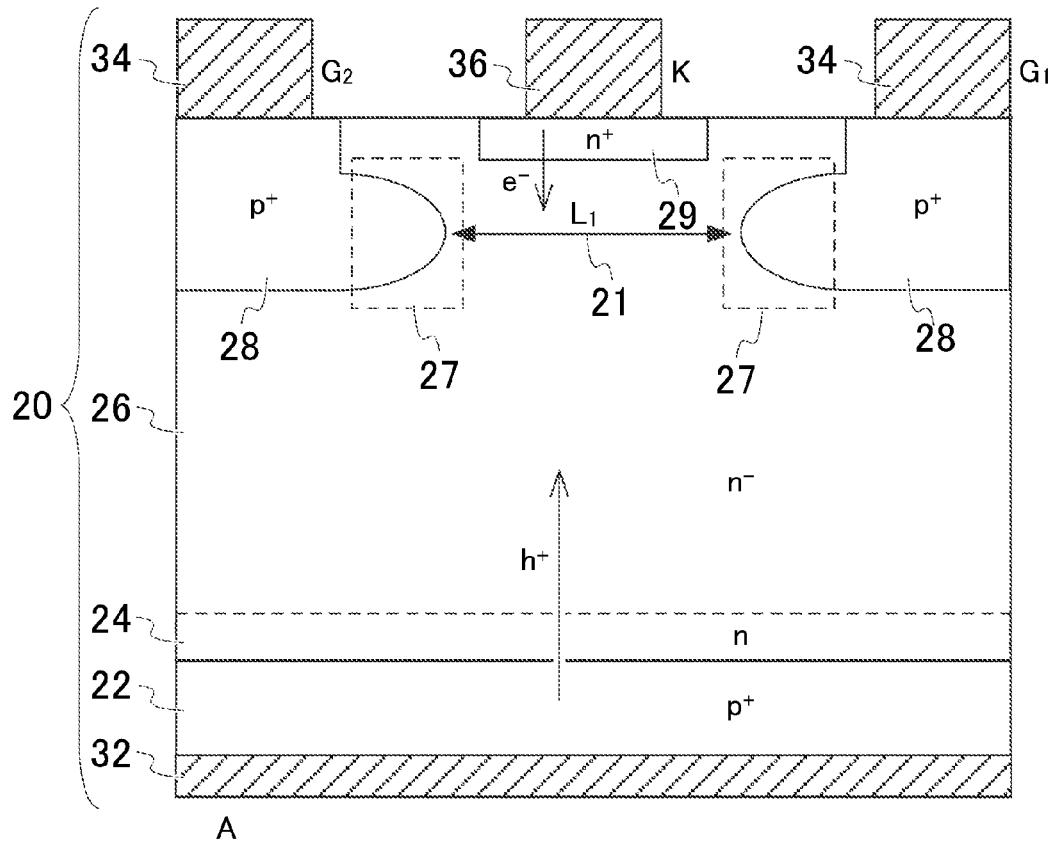
FIG. 8 is a cross-sectional view of the essential components of a SI thyristor 14 according to a first modification.

FIG. 8 is a cross-sectional view of the essential components of an SI thyristor 14 according to a first modification. A pair of $p^+$-type regions 28 in the SI thyristor 14 in the present example respectively include protruding regions 27 that protrude from the gate electrode 34 toward the cathode electrode 36, in a manner to draw close to each other. The protruding regions 27 may be regions that protrude beyond the $p^+$-type regions 28 of the SI thyristor 10. In this way, the channel width 21 defined by the shortest distance between the pair of $p^+$-type regions 28 becomes shorter than in the SI thyristor 10 according to the first embodiment.

By reducing the length $L_1$ of the channel width 21, the depletion layer formed by the $p^+$-type regions 28 and the $n^-$-type layer 26 expands more easily. Accordingly, even when the potential of the gate $G_1$ of the SI thyristor 14 and the potential of the gate $G_1$ of the SI thyristor 10 are the same, the SI thyristor 14 can more reliably cut off the current between the anode A and the cathode K.

Figure 9:
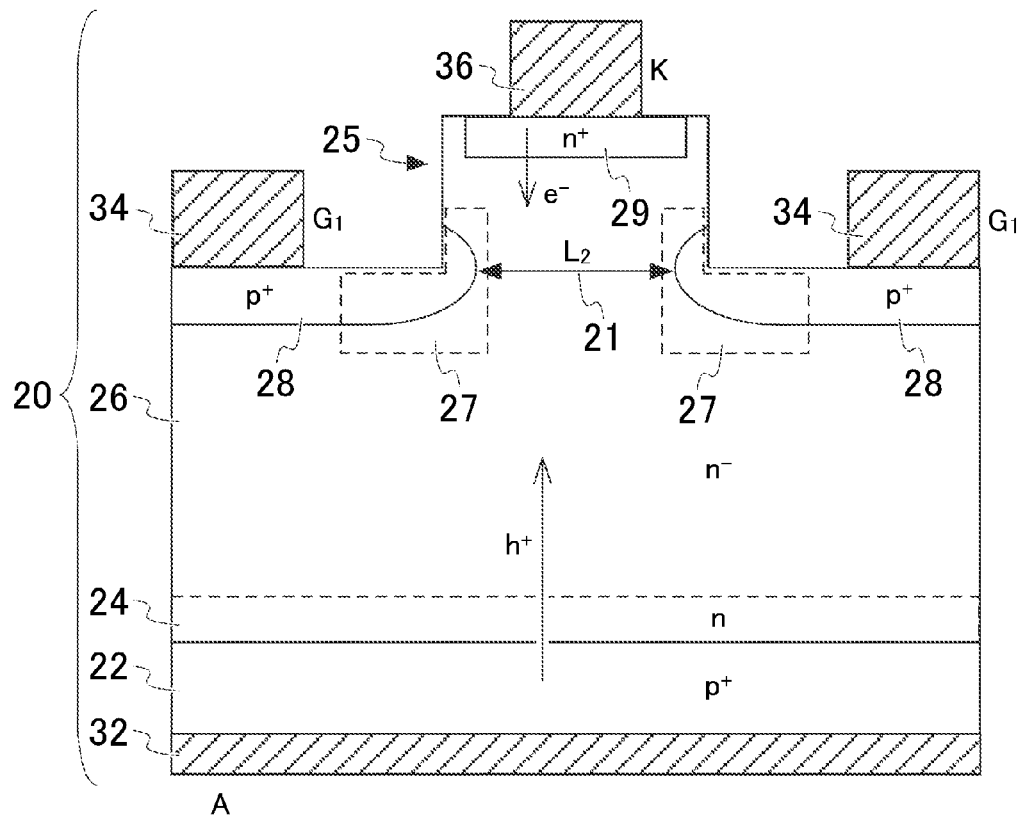
FIG. 9 is a cross-sectional view of the essential components of a SI thyristor 18 according to a second modification.

FIG. 9 is a cross-sectional view of the essential components of a SI thyristor 18 according to a second modification. The SI thyristor 18 in this example includes a mesa portion 25. The mesa portion 25 in this example is a portion of the $n^-$-type layer 26 provided by partially removing a region where the $p^+$-type region 28 is provided in the first and second embodiments. The $p^+$-type region 28 in the present example is provided on the bottom of this region from which a portion has been partially removed. Furthermore, in the present example, a pair of the $p^+$-type regions 28 respectively include protruding regions 27 that protrude in a manner to draw near each other. The protruding regions 27 may be regions that protrude even farther than the $p^+$-type regions 28 of the SI thyristor 14.

The protruding regions 27 in the present example are provided reaching to the mesa portion 25. In this way, the length $L_2$ of the channel width 21 is made shorter than the length $L_1$ of the channel width 21 in the first modification. Accordingly, even when the potential of the gate $G_1$ of the SI thyristor 18 and the potential of the gate $G_1$ of the SI thyristor 14 are the same, the SI thyristor 18 can more reliably cut off the current between the anode A and the cathode K.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: SI thyristor, 14: SI thyristor, 18: SI thyristor, 20: semiconductor substrate, 21: channel width, 22: $p^+$-type layer, 24: n-type layer, 25: mesa portion, 26: $n^-$-type layer, 72: protruding region, 28: $p^+$-type region, 29: $n^+$-type region, 32: anode electrode, 34: gate electrode, 36: cathode electrode, 40: MOSFET, 43: FWD, 45: IGBT, 50: semiconductor substrate, 52: drain layer, 54: drift layer, 56: base region, 58: contact region, 59: source region, 62: drain electrode, 64: gate electrode, 65: gate insulating film, 66: source electrode, 70: semiconductor substrate, 72: collector layer, 73: FS layer, 74: drift layer, 76: base region, 78: contact region, 79: emitter region, 82: collector electrode, 84: gate electrode, 85: gate insulating film, 86: emitter electrode, 90: substrate, 91: insulated substrate, 92: conducting layer, 93: resin, 94: conductive adhesive layer, 95: conductive post, 96: external output terminal, 97: print board, 98: insulated substrate, 99: conducting layer, 100: semiconductor device, 200: semiconductor device

What is claimed is:

1. A semiconductor device comprising:
    a normally-ON semiconductor element that includes a first semiconductor layer capable of conductivity modulation and a first gate electrode, but does not include a gate insulating film between the first gate electrode and the first semiconductor layer; and
    a normally-OFF semiconductor element that includes a second semiconductor layer, a second gate electrode, and a gate insulating film between the second semiconductor layer and the second gate electrode, wherein
    the normally-ON semiconductor element and the normally-OFF semiconductor element are connected in series.

2. The semiconductor device according to claim 1, wherein
    the normally-ON semiconductor element and the normally-OFF semiconductor element have a cascode connection, such that the normally-ON semiconductor element is turned OFF when the normally-OFF semiconductor element is turned OFF.

3. The semiconductor device according to claim 2, wherein the normally-OFF semiconductor element is one of an IGBT having an emitter electrode and a MOSFET having a source electrode, the normally-ON semiconductor element is a static induction thyristor, and in the cascode connection, the first gate electrode of the static induction thyristor is electrically connected to one of the emitter electrode and the source electrode of the normally-OFF semiconductor element.

4. The semiconductor device according to claim 1, wherein the second semiconductor layer of the normally-OFF semiconductor element includes one of silicon carbide and gallium nitride.

5. The semiconductor device according to claim 1, wherein the first semiconductor layer of the normally-ON semiconductor element includes one of silicon carbide and gallium nitride.

6. The semiconductor device according to claim 1, wherein the normally-ON semiconductor element has a higher withstand voltage than the normally-OFF semiconductor element.

7. The semiconductor device according to claim 1, comprising:

a first semiconductor substrate on which the normally-ON semiconductor element is provided; and a second semiconductor substrate on which the normally-OFF semiconductor element is provided, the second semiconductor substrate being different from the first semiconductor substrate.

8. The semiconductor device according to claim 7, further comprising:

a substrate on which the first semiconductor substrate and the second semiconductor substrate are mounted.

9. The semiconductor device according to claim 7, further comprising:

light-blocking resin between the first semiconductor substrate and the second semiconductor substrate.

* * * * *